United States Patent [19]

King

[11] Patent Number: 4,933,746
[45] Date of Patent: Jun. 12, 1990

[54] THREE-LEGGED CLIP
[75] Inventor: Robert D. King, Laconia, N.H.
[73] Assignee: Aavid Engineering, Inc., Laconia, N.H.
[21] Appl. No.: 243,407
[22] Filed: Sep. 12, 1988
[51] Int. Cl.$^5$ .............................. H01L 23/02
[52] U.S. Cl. ...................... 357/81; 357/79; 165/80.3
[58] Field of Search .............. 357/79, 81; 165/80.2, 165/80.3; 174/16.3

[56] References Cited
U.S. PATENT DOCUMENTS
4,509,839 4/1985 Lavochkin .................... 357/79

Primary Examiner—Andrew J. James
Assistant Examiner—Mark Prenty
Attorney, Agent, or Firm—Fish & Richardson

[57] ABSTRACT

A resilient spring clip for attaching a semiconductor to a heat sink comprising a first surface having a first edge with a first leg projecting from a central portion of the first edge, and a second edge, parallel to the first edge and spaced apart therefrom with second and third legs projecting from the second edge, the legs being offset from each other and having heels on their ends opposite the first surface so that by flexing the legs inwardly, the heels can fit completely through slots on a heat sink, the clip being held in place when the legs unflex so that the heels engage the heat sink and cannot pass through the slots.

19 Claims, 2 Drawing Sheets

THREE-LEGGED CLIP

FIELD OF THE INVENTION

This invention relates to dissipation of heat from electronic semiconductor devices, and in particular, the attachment of such semiconductors to heat sinks for that purpose.

BACKGROUND OF THE INVENTION

The use of semiconductors is limited not only by their size but in particular by the size of the heat sinks that must be used with them. Indeed, heat sinks, which successfully expel and prevent heat build-up as the semiconductors operate, are often far larger and more bulky than the semiconductors themselves. This is of primary consideration when the semiconductor is to be mounted on a circuit board where space is of the essence. In addition, the means for attaching the semiconductor to the heat sink may also be bukly, and the attaching mechanism may extend beyond the heat sink thereby wasting additional circuit board space. Hence, there is a need for a compact means of attaching a semiconductor device to a heat sink, and preferably, a means to attach more than one such device to a heat sink in as compact a manner as possible.

One way of attaching semiconductors to heat sinks is by use of a resilient spring clip. However, spring clips can be large and difficult to use. Further, some require special orientation or tools for assembly, which is usually by hand. As a result, there is a need for a clip attachment which is small and compact, easy to attach, and which will permit multiple semiconductors to be attached to a single heat sink without taking up extra space.

SUMMARY OF THE INVENTION

The present invention comprises a resilient spring clip for use in attaching a semiconductor to a heat sink so that the resulting semiconductor-heat sink combination is as compact as possible. The clip of this invention also permits easy assembly of the semiconductor to the heat sink and allows more than the semiconductor to be attached to the same heat sink.

In the preferred embodiment, the resilient clip of this invention is metal and unitary. It has three principal portions. First, there is an inwardly indented top with two major edges opposite each other. A pair of attachment legs extends from the ends of one edge in the same direction as the indentation. A single attachment leg extends in the same direction from the center of the opposite edge. All three legs are resilient, and the end of each leg opposite the top has an attachment means in the form of a protruding heel and toe.

In operation, the clip is installed on a heat sink so that the indented top contacts the semiconductor to be attached. The legs extend more or less perpendicularly from the top and partially surround the semiconductor. The clip is secured to a heat sink by its legs, with the heel and toe portion of each fitting onto elongated slots on the heat sink. The legs, which are resilient, are flexed inwardly toward each other (and the semiconductor therebetween) to allow their heels and toes to fit through the slots on the heat sink. Once the heels are through the slots, the legs flex backward to their original position. The heels then cannot slide back through the slots, and thus they prevent the clip from coming off. The clip can be removed to replace the semiconductor by reflexing the legs again.

As there are two legs on one side of the clip and one leg on the other, all of which are offset, a corresponding clip and semiconductor can be attached on the opposite side of the heat sink through the same slots. The two legs of the first clip only fill a portion of the slot in the heat sink. There is still a central portion of the slot open. The single leg of the first clip only fills the central portion of its slot. Thus, the ends of that slot are open. As a result, a second clip can be inserted on the opposite side of the heat sink, with its single leg inserted into the central slot space between the two legs of the first clip and its double legs into the slot space adjacent to the single leg of the first clip The clip of the invention is simple and inexpensive to manufacture, and assembly onto the heat sink is rapid and straightforward, requiring no special tools. Removal is equally simple, requiring only a flexing of the legs to force the heels inwardly to allow them to again pass through the slots. The complementary arrangement of the legs allows for mounting of two semiconductors onto opposite surfaces of a single wall of a heat sink. The clip itself is compact, so that when assembly is complete, the clip projects only minimal a distance, if at all, beyond the semiconductor.

DESCRIPTION OF THE PREFERRED EMBODIMENTS

I now turn to the description of the preferred embodiment, after first briefly describing the drawings.

Drawings

Structure

Figure 1:
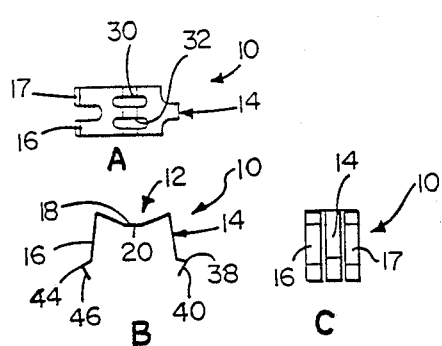
FIG. 1a is a top view of a retaining clip of the invention.
FIG. 1b is a front view of the clip of the invention.
FIG. 1c is a side view of the clip of the invention.

With reference to FIGS. 1a, 1b and 1c, a retaining clip according to the invention is shown at 10. Retaining clip 10 generally includes a top portion 12, single leg 14, and a pair of legs 16, 17.

The top portion 12 of the retaining clip 10 has three sections. A flat section 18, having a semiconductor contact surface 20 on its underside, is bounded by two upwardly angled sections 22, 24. As best shown in FIG. 1b, and in the perspective view of FIG. 3, this creates a top portion 12 that is somewhat indented. The angled sections 22, 24 have edges 28 opposite the flat section 18, and a pair of slots 30, 32 extend parallel to each other longitudinally across the top portion 12.

Leg 14 extends downwardly from the central portion of edge 26 of angled section 22. Leg 14 is comprised of an upper portion 34, which is attached at one end to edge 26, and a lower portion which comprises an outwardly projecting heel 38 and a toe portion 40 which extends at an inward angle from the heel 38. The leg 14 is generally resilient and flexes inwardly towards the pair of legs 16, 17 opposite, when pressure is applied to it in that direction. The pair of legs 16, 17 extend downwardly from the edge 28 of angled section 24. Legs 16, 17 are identical to leg 14 except that legs 16, 17 are disposed at opposite ends of the edge 28 instead of being centrally located. As shown in the side view of FIG. 1c, this means that the three legs 14, 16, 17 are complementary, in that when viewed from the side of the clip 10, none of the legs overlap. Leg 16 has an upper portion 42 and a heel 44 and toe 46, which are identical to that of leg 14. Leg 17 has the same arrangement, with a heel 45 and a toe 47. As with leg 14, legs 16, 17 also flex inwardly when pressure is applied to them in that direction.

Figure 2:
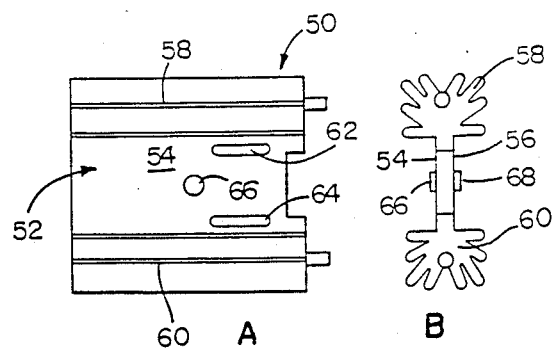
FIGS. 2a and 2b are views of a heat sink for use with the clip of this invention.

With reference to FIG. 2a, 2b, a heat sink 50 suitable for use in conjunction with clip 10 is shown. Heat sink 50 generally includes a flat plate 52 having a first surface 54 and a second surface 56. The plate 52 is bounded by heat dissipating fins 58, 60 extending along each side of the plate 52. A pair of mounting pins 59, 61 extend from one end of each of the fins 58, 60. In assembly, these pins 59, 61 hold the heat sink 50 to a circuit board (not shown) in an upright fashion. A pair of slots 62, 64 extend through the plate 52 near the fins 58, 60 and a pair of pins 66, 68 extend from the first and second surfaces 54, 56, as best shown in FIG. 2b.

Figure 3:
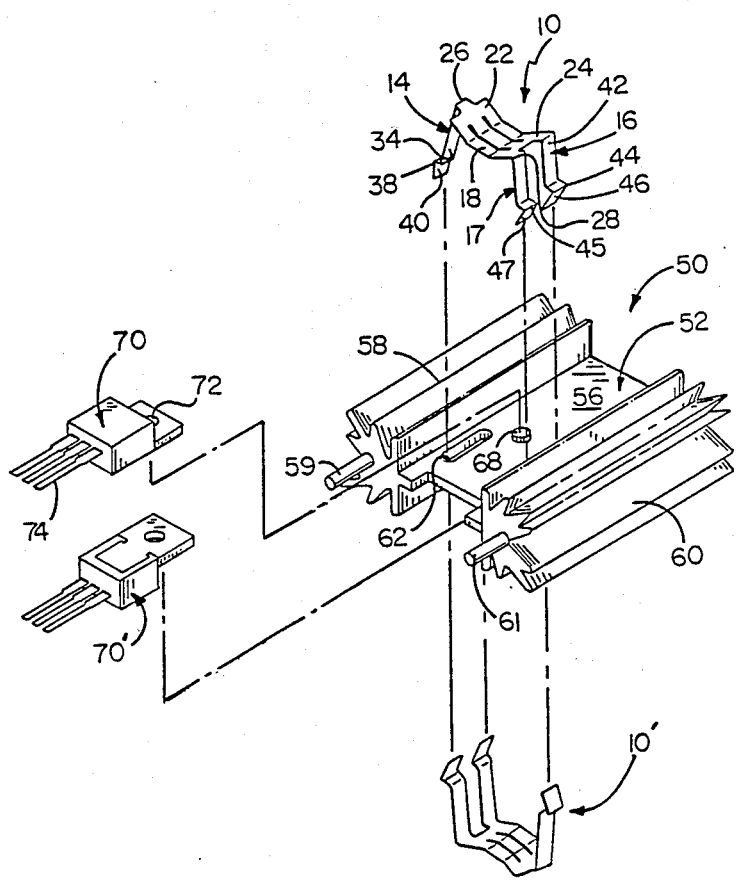
FIG. 3 is an exploded view of a heat sink, clip and semiconductor assembly, showing the relation of two clips to the heat sink and to two semiconductors.

Referring to FIG. 3, the assembly of a pair of clips 10 and 10' to a pair of semiconductors 70, 70' and the heat sink 50 is shown. The semiconductor 70 is oriented by placing an alignment hole 72 over the pin 68 of the surface 56 of the plate 52 of the heat sink 50. Connecting pins 74 of the semiconductor 70 project in the same direction as pins 59, 61 from the fins 58, 60 of the heat sink 50 to connect the semiconductor 70 to the circuit board (not shown). When in use, heat from the semiconductor 70 is dissipated through the surface 52 to the fins 58, 60.

Figure 4:
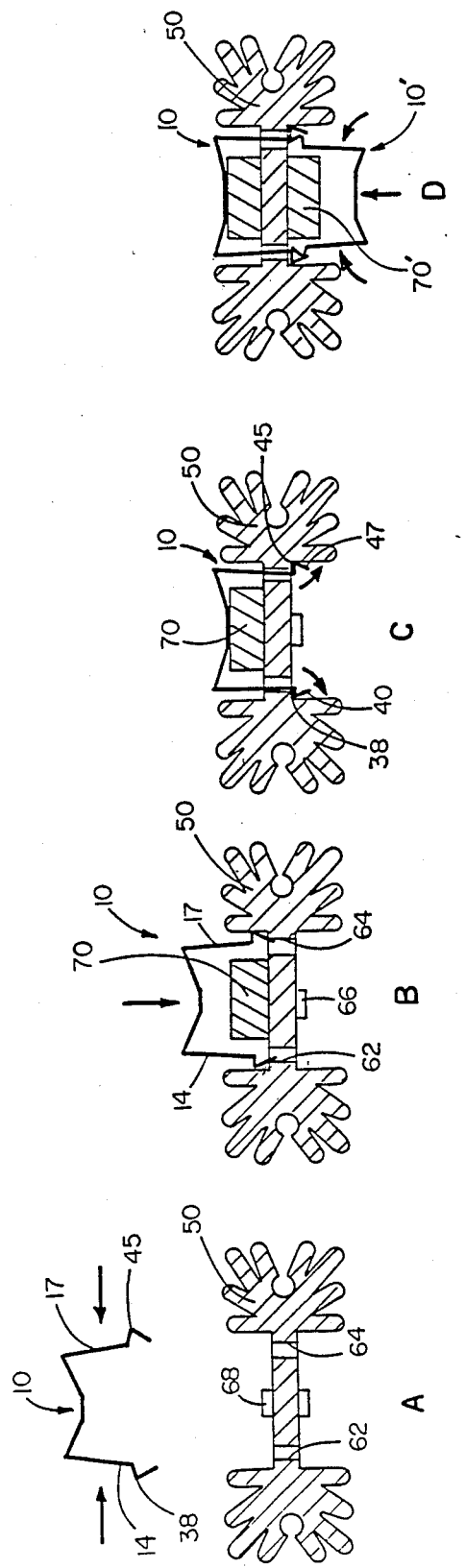
FIGS. 4a, 4b, 4c and 4d show in cross-section the steps of securing a pair of semiconductors to a heat sink using the retaining clip of the invention.

Referring now to FIGS. 3 and 4, the semiconductor 70 is fastened to the heat sink 50 by clip 10. Clip 10 fits over the semiconductor 70 so that the contact surface 20 of its flat section 18 is against the top of the semiconductor 70 opposite the plate 52 of the heat sink 50. This basic positioning is shown in FIGS. 4a and 4b. As shown in FIG. 4a, slight manual pressure is applied to the legs 14, 16, 17 so that they to flex inwardly toward each other. As a result, their toes and heels align with and fit into the slots 62, 64 on the heat sink 50, as shown in FIG. 4b. Clip 10 is then pressed downwardly, as shown in FIG. 4c. As the downward movement of clip 10 continues, the heels 38, 44, 45 pass completely through the slots 62, 64, and when they do, the legs 14, 16, 17 flex outwardly again causing the heels 38, 44, 45 to engage the plate 52, as shown in FIG. 4c. This locks the clip in place. The clip 10 and the semiconductor device 70 can be easily removed by reflexing the legs 14, 16, 17 to allow the heels 38, 44, 45 to fit up through the slots 62, 64 again.

A second semiconductor 70' can be fastened to the same heat sink 50 on the other side 54. As shown in FIG. 3, a second clip 10' is positioned with its toes directed towards slots 62, 64 from the other side 54 of the plate 52. The second clip 10' can then be inserted in the same manner as the first, as long as the single leg of the clip 10' is inserted into the slot holding the double legs of the clip 10 from the other side. In that manner, due to the complementary nature of the leg arrangements, the same slots can be used to hold two clips, one for each side, and the need for a separate heat sink for the second device is eliminated. It should also be appreciated, as shown in FIG. 4d, that, when assembled, the clip does not project beyond the heat sink (or does so only by a small amount) so that the heat sink with the clip and semiconductor does not take up much more space than the heat sink itself. Further, it should also be appreciated that the assembly of the clip and the heat sink does not require any special tools, and disassembly (to replace a defective semiconductor, for example) is simple.

Other embodiments will occur to those skilled in the art.

What I claim is:

1. A clip for attaching a semiconductor to a heat sink comprising:
    a first surface,
    a first leg means,
        said first leg means being connected to a first portion of said first surface,
    a second leg means,
        said second leg means being connected to a second portion of said first surface, said second portion being spaced apart from said first portion,
    said first surface, said first leg means and said second leg means defining three sides of an opening which is adapted to receive the semiconductor when said heat sink is in use with the semiconductor contacting said first surface,
    said first leg means and said second leg means being somewhat resilient and able, when force is applied, to temporarily flex in a first direction towards said semiconductor opening, said first leg means and said second leg means being offset so that they are not aligned in the direction of their flex towards said opening,
    said first leg means and said second leg means having a first attachment means and a second attachment means respectively,
    said first attachment means and said second attachment means being disposed opposite said first surface, whereby the semiconductor is attached to the heat sink by placing the semiconductor in said opening and flexing said first leg means and said second leg means in the first direction so that said first attachment means and said second attachment means pass through slots in the heat sink whereupon said first and second leg means are allowed to return to their unflexed position thereby holding said clip and the semiconductor in place.

2. The clip of claim 1 wherein said first surface has a metal plate.

3. The clip of claim 1 wherein said first surface is indented.

4. The clip of claim 1 wherein said first surface comprises a flat section bounded at opposite ends by angled sections so that said first surface is generally indented.

5. The clip of claim 1 wherein said first leg means comprises a single first leg.

6. The clip of claim 5 wherein said first leg is generally rectangular and is attached at one of its narrow sides to said first surface.

7. The clip of claim 5 wherein said first leg is attached to a central portion of a first edge of said first surface.

8. The clip of claim 7 wherein said first attachment means comprises a first projecting heel, said first heel being disposed near the end of said first leg opposite said first surface.

9. The clip of claim 8 wherein said first heel projects away from said opening.

10. The clip of claim 9 wherein a first toe piece is angled from said first heel, said first toe piece comprising the end of said first leg opposite said first surface.

11. The clip of claim 1 wherein said second leg means comprises a second leg and a third leg, said legs being separate legs which are spaced apart.

12. The clip of claim 11 where said second and third legs are generally rectangular, and both are attached at one of their narrow sides to said first surface.

13. The clip of claim 11 wherein said second leg and said third leg are attached to the ends of a second edge of said first surface, said second edge being generally parallel to and spaced apart from a first edge to which said first leg means is attached.

14. The clip of claim 13 wherein said first leg means comprises a single leg which is generally rectangular and attached at one of its narrow sides to a central portion of said first edge.

15. The clip of claim 13 wherein said second attachment means comprises a second projecting heel disposed on said second leg and a third projecting heel disposed on said third leg, said heels being disposed near the end of said second and third legs opposite said first surface.

16. The clip of claim 15 wherein said first leg means comprises a first leg attached to a central portion of a first edge of said first surface, said first attachment means comprising a first projecting heel disposed near the end of said first leg opposite said first surface.

17. The clip of claim 15 wherein said second and third heels project away from said opening.

18. The clip of claim 17 wherein a second toe piece and a third toe piece are angled from said second heel and said third heel respectively, said two toe pieces comprising the end of said second and third legs opposite said first surface.

19. The clip of claim 16 wherein said first second and third legs are disposed to fit into a pair of slots on heat sink leaving space in the slots for the legs of a similar clip to be inserted into those slots from the opposite side.

* * * * *